United States Patent
Hsu

(10) Patent No.: US 8,748,083 B2
(45) Date of Patent: Jun. 10, 2014

(54) METHOD FOR FORMING WIRES WITH NARROW SPACING

(71) Applicant: Chunghwa Picture Tubes, Ltd., Bade (TW)

(72) Inventor: Han-tung Hsu, Daxi Township, Taoyuan County (TW)

(73) Assignee: Chunghwa Picture Tubes, Ltd., Bade, Taoyuan (TW)

( * ) Notice: Subject to any disclaimer, the term of this patent is extended or adjusted under 35 U.S.C. 154(b) by 0 days.

(21) Appl. No.: 13/737,015

(22) Filed: Jan. 9, 2013

(65) Prior Publication Data

US 2014/0131305 A1    May 15, 2014

(30) Foreign Application Priority Data

Nov. 15, 2012    (TW) .............................. 101142655 A

(51) Int. Cl.
*G03F 7/26*    (2006.01)

(52) U.S. Cl.
USPC .......................................... 430/315; 430/313

(58) Field of Classification Search
CPC ...................... H01L 27/1214; H01L 21/31144; H01L 24/11; H01L 21/31116; H01L 21/32139; H01L 28/75; H01L 29/4908; H01L 29/41733; H01L 45/1675; H01L 21/0273; H01L 21/31138; H01L 2224/116; H01L 21/76865; H01L 27/3262; H01L 23/53252; H01L 21/4828
USPC .......................................... 430/315, 313, 319
See application file for complete search history.

(56) References Cited

U.S. PATENT DOCUMENTS

2007/0172998 A1 *    7/2007    Lee .............................. 438/149

FOREIGN PATENT DOCUMENTS

TW    200933891    8/2009

* cited by examiner

*Primary Examiner* — Caleen Sullivan
(74) *Attorney, Agent, or Firm* — Lowe Hauptman & Ham, LLP

(57) ABSTRACT

A method for forming wires with a narrow spacing is provided. The method includes the steps of: sequentially forming a first metal layer and a protective layer on a substrate; using a first photomask to pattern the first metal layer and the protective layer, so as to form a first metal line and a patterned protective layer thereon; forming a second metal layer on the substrate and the patterned protective layer; using a second photomask to pattern the second metal layer, so as to form a second metal line adjacent to the first metal line; and removing the patterned protective layer on the first metal line. According to the method, the wires can be located at the same layer with a narrow spacing, thereby avoiding a problem that the wires are easily broken.

13 Claims, 9 Drawing Sheets

METHOD FOR FORMING WIRES WITH NARROW SPACING

CROSS-REFERENCE TO RELATED APPLICATION

This application claims priority from and the benefit under 35 U.S.C. §119(a) of Taiwanese Patent Application No. 101142655, filed on Nov. 15, 2012 in the TIPO (Taiwan Intellectual Property Office), which is hereby incorporated by reference for all purposes as if fully set forth herein.

TECHNICAL FIELD OF THE INVENTION

The present invention relates to a wiring method for a display, and especially to a layout method of wires for a narrow bezel display.

BACKGROUND OF THE INVENTION

A compact size and big picture screen have become a mainstream development of displays; thus, a demand for the display with a narrow bezel is increased. However, with the growth of a resolution of the displays, an amount of scan lines and data lines which are positioned outside a display area also increases. Therefore, under the situation of the narrower bezel as well as increasing circuit traces in the display, how to design the traces within the narrow space has become a different problem for manufacturers.

Moreover, due to a resolution limit of exposure machines, the minimal spacing between lines has a certain limit; thus, all the traces can not be arranged on an identical layer. Therefore, a dual trace on two respective layers has been proposed. Referring to FIG. 1, FIG. 1 depicts a schematic drawing illustrating a display with the dual trace in the prior. There are a plurality of traces 20 positioned around an active area 12 of a liquid crystal substrate 10; the traces 20 establish a coupling between a driver chip 14 and active devices within the active area 12. The traces 20 may include data lines and scan lines. Whether the data lines or the scan lines, the so-called dual trace means that any two adjacent traces 20 are respectively located at different layers, as shown in an enlarged, partial cross-sectional view on the right side of FIG. 1. By this design, the two adjacent traces 20 can be extremely close; as a result, the space around the active area 12 can be reduced, thereby achieving the demand for the narrow bezel products.

However, because a thickness of a protective layer 25 covering the traces 20 that is positioned at an upper layer 25 is thinner, the protective layer 25 is broken easily, to cause a broken line. In addition, as shown in FIG. 1, because the two adjacent traces 20 are extremely close, it may cause a poor coating ability for the protective layer 25, resulting in a crack easily. That is also easy to make the protective layer 25 break, and similarly causes that the trace 20 at the upper layer is broken.

Moreover, although materials and process parameters for fabricating the traces 20 on the upper and lower layers are the same, the traces 20 on the upper and lower layers may have different line widths due to a variation in the manufacture processes because the upper and lower traces 20 are formed on the different layers. This makes the traces 20 on the upper and lower layers have different resistances, and it may cause a striped defect on a display image.

Accordingly, there is a need to improve the conventional technology, so as to overcome the drawbacks of the broken lines existed in the dual trace and the striped defect formed on the display image in the prior art.

SUMMARY OF THE INVENTION

Accordingly, an objective of the present invention is to provide a method for forming wires with a narrow spacing, thereby improving the drawbacks of the broken lines existed in the dual trace and the striped defect formed on the display image in the prior art.

To achieve the foregoing objective, according to an aspect of the present invention, the present invention provides a method for forming wires with a narrow spacing. The method includes the steps of: sequentially forming a first metal layer and a protective layer on a substrate; using a first photomask to pattern the first metal layer and the protective layer, so as to form a first metal line and a patterned protective layer thereon; forming a second metal layer on the substrate and the patterned protective layer; using a second photomask to pattern the second metal layer, to form a second metal line adjacent to the first metal line; and removing the patterned protective layer on the first metal line.

In one preferred embodiment, the step of using the first photomask to pattern further comprises steps of: forming a photoresist layer on the protective layer; exposing the photoresist layer via the first photomask; developing the exposed photoresist layer for forming a patterned photoresist layer; sequentially etching parts of the protective layer and the first metal layer which are not covered by the patterned photoresist layer; and removing the patterned photoresist layer.

In the preferred embodiment, the step of using the second photomask to pattern further comprises steps of: forming a photoresist layer on the second metal layer; exposing the photoresist layer via the second photomask; developing the exposed photoresist layer for forming a patterned photoresist layer; etching parts of the second metal layer which are not covered by the patterned photoresist layer; and removing the patterned photoresist layer.

In the preferred embodiment, the first metal layer has a first side-etched removal when etching the first metal layer; the second metal layer has a second side-etched removal when etching the second metal layer; and the first side etched removal is identical to the second side-etched removal. In another preferred embodiment, the first side etched removal is similar to the second side-etched removal.

In the preferred embodiment, the first metal line and the second metal line are formed to have a spacing between the first metal line and the second metal line, and the spacing is less than a minimal line spacing that can be reached in the patterning step. Preferably, the spacing is less than 1.5 micrometers. In the preferred embodiment, the first metal layer and the second metal layer are made of an identical metal material.

In comparison with the prior art, the present invention employs the two photomask processes to form the first metal line and the second metal line on the same layer, thereby overcoming the limitation of the line spacing of the exposure machine to achieve the demand of the narrow bezel. In addition, because the first metal line and the second metal line are formed on the same layer, the drawback of the broken line in the conventional dual trace is overcome. For the same reason, because the first metal line and the second metal line are formed on the same layer, the manufacture processes are easily controlled to reach the same line widths, so as to solve the striped defect stemming from the different line widths in the prior.

It is to be understood that both the foregoing general description and the following detailed description of the present invention are exemplary and explanatory and are intended to provide further explanation of the invention as claimed.

DETAILED DESCRIPTION OF THE INVENTION

Figure 1:
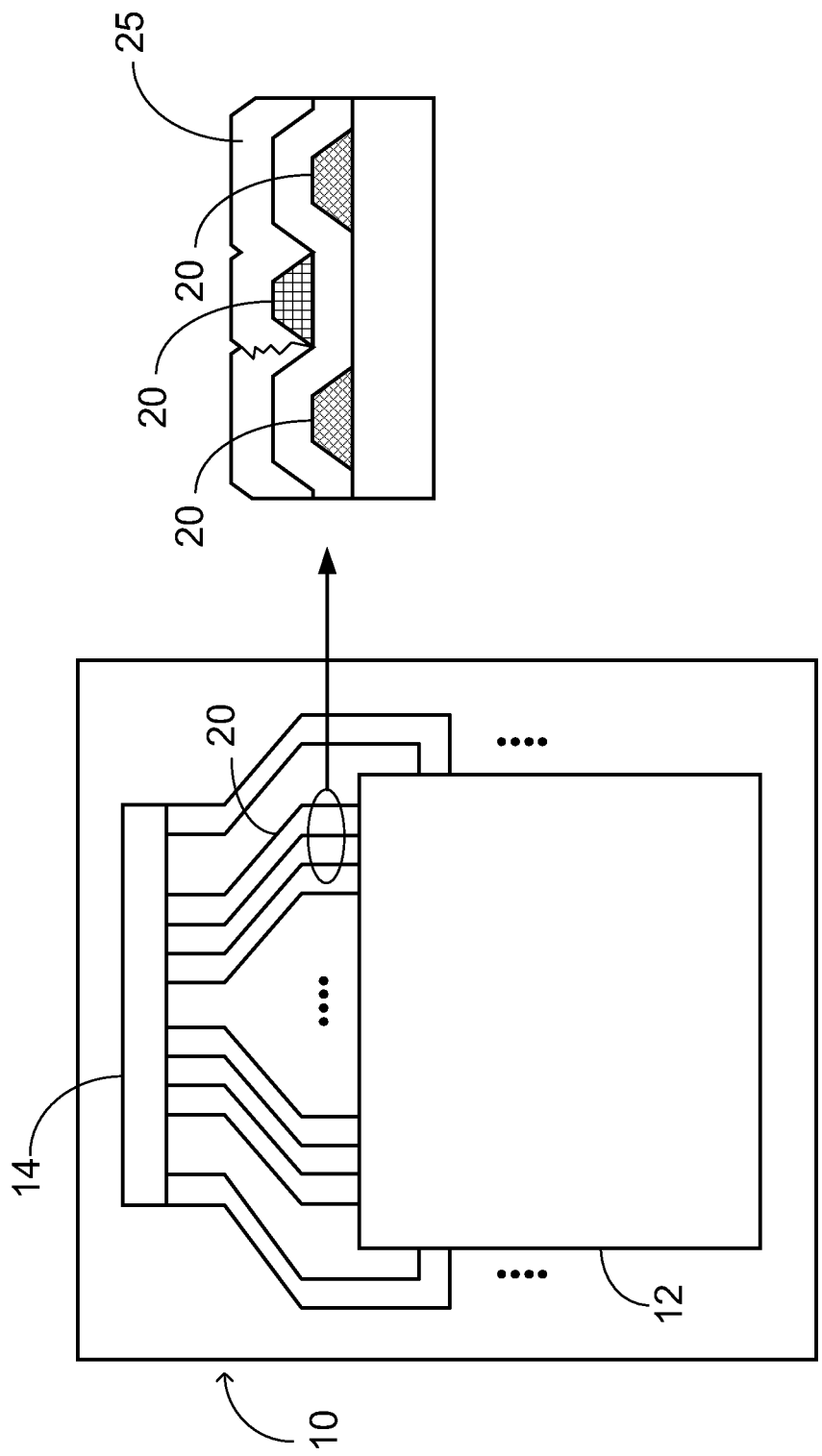
FIG. 1 depicts a schematic drawing illustrating a display with the dual trace in the prior.
Figure 2:
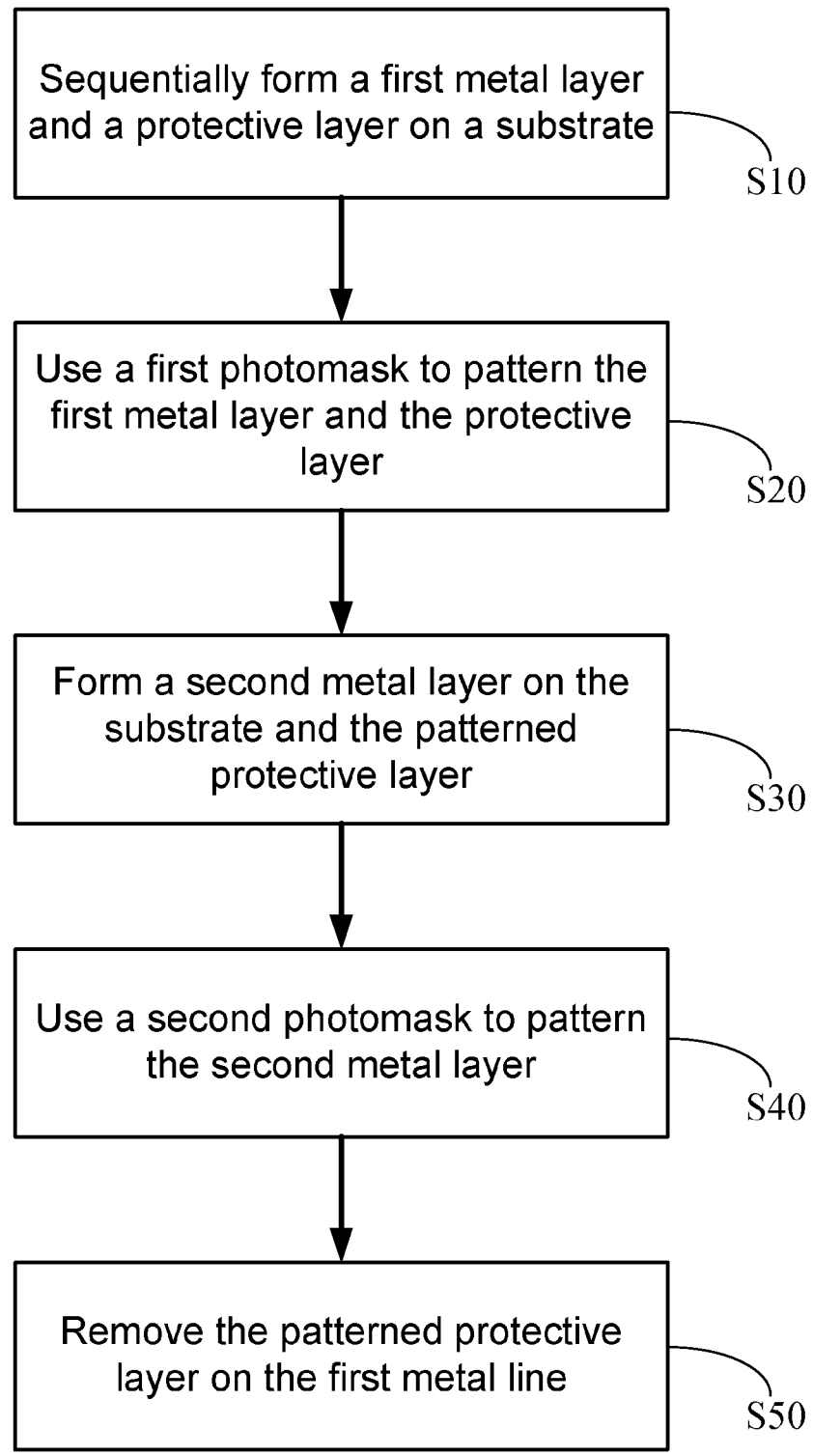
FIG. 2 is a flow chart illustrating a method for forming wires with a narrow spacing according to a preferred embodiment of the present invention.
Figure 3:
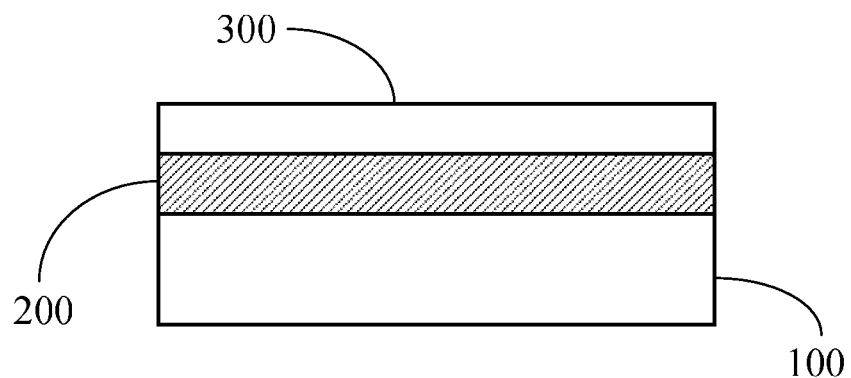
FIG. 3 is a schematic drawing illustrating the step S10.

Referring to FIG. 2, FIG. 2 is a flow chart illustrating a method for forming wires with a narrow spacing according to a preferred embodiment of the present invention. The method for forming wires with a narrow spacing of the preferred embodiment of the present invention begins with step S10. Referring to FIG. 3 and FIG. 2, FIG. 3 is a schematic drawing illustrating the step S10.

At step S10, a first metal layer 200 and a protective layer 300 are sequentially formed on a substrate 100, and then step S20 is carried out. Specifically, the first metal layer 200 can be formed by using a physical vapor deposition or a chemical vapor deposition. Subsequently, the protective layer 300 is coated on the first metal layer 200.

Figure 4:
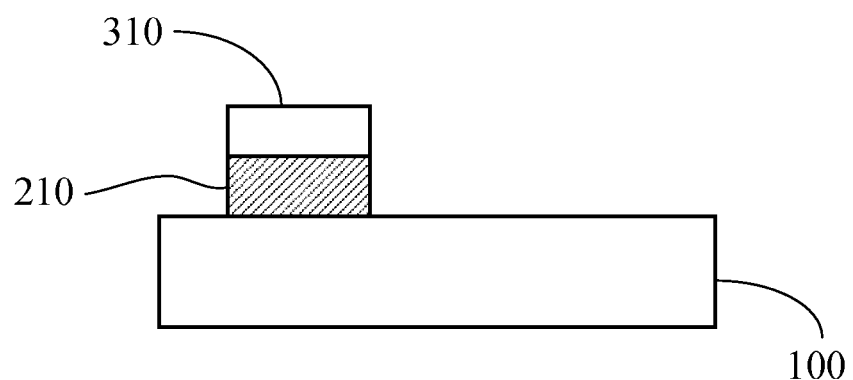
FIG. 4 is a schematic drawing illustrating the step S20.

Referring to FIG. 4 and FIG. 2, FIG. 4 is a schematic drawing illustrating the step S20. At step S20, the first metal layer 200 and the protective layer 300 are patterned by using a first photomask (referring to FIG. 6), so as to form a first metal line 210 and a patterned protective layer 310 thereon, and then the step S30 is carried out.

Figure 5:
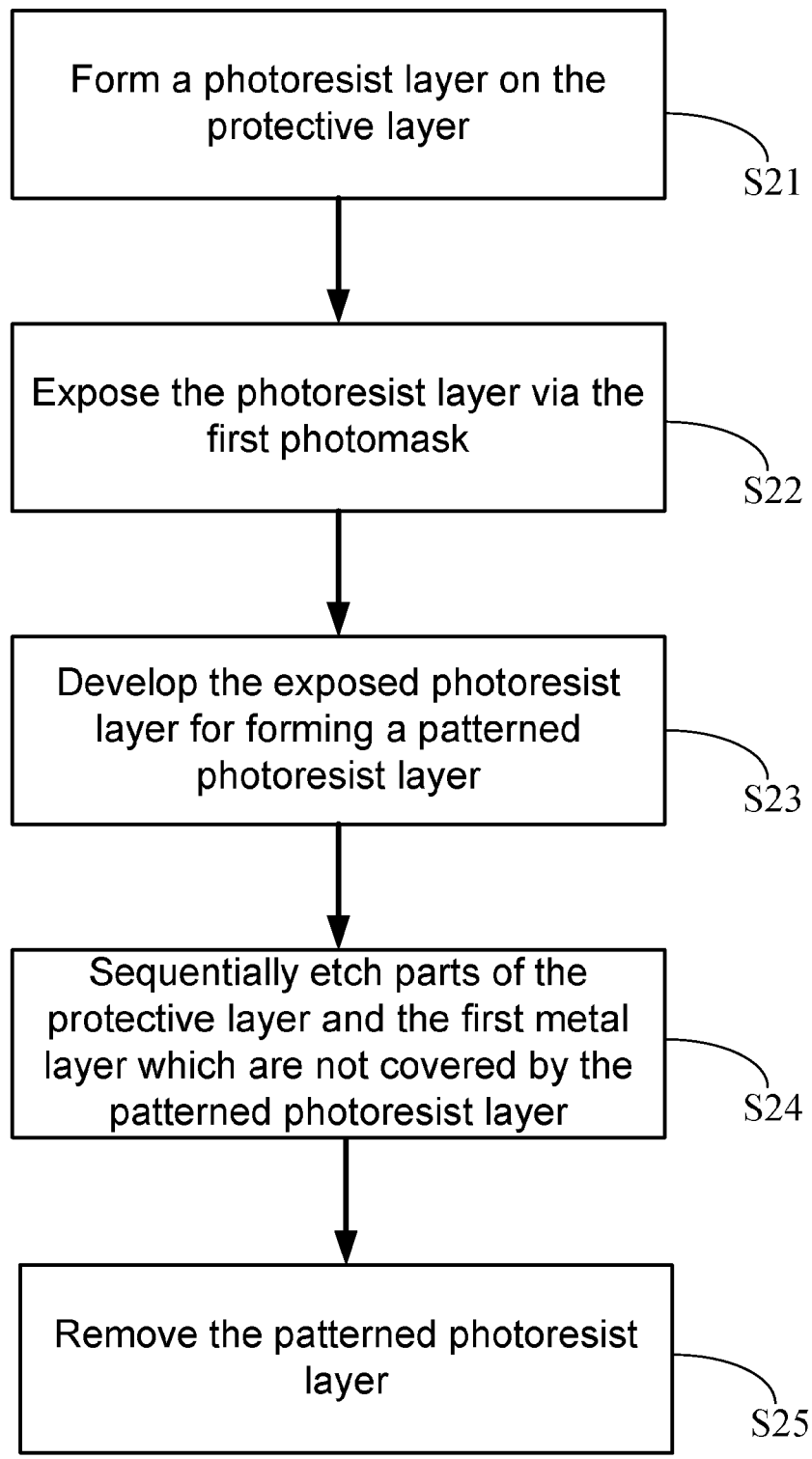
FIG. 5 is a flow chart illustrating the steps of using the first photomask to pattern.
Figure 6:
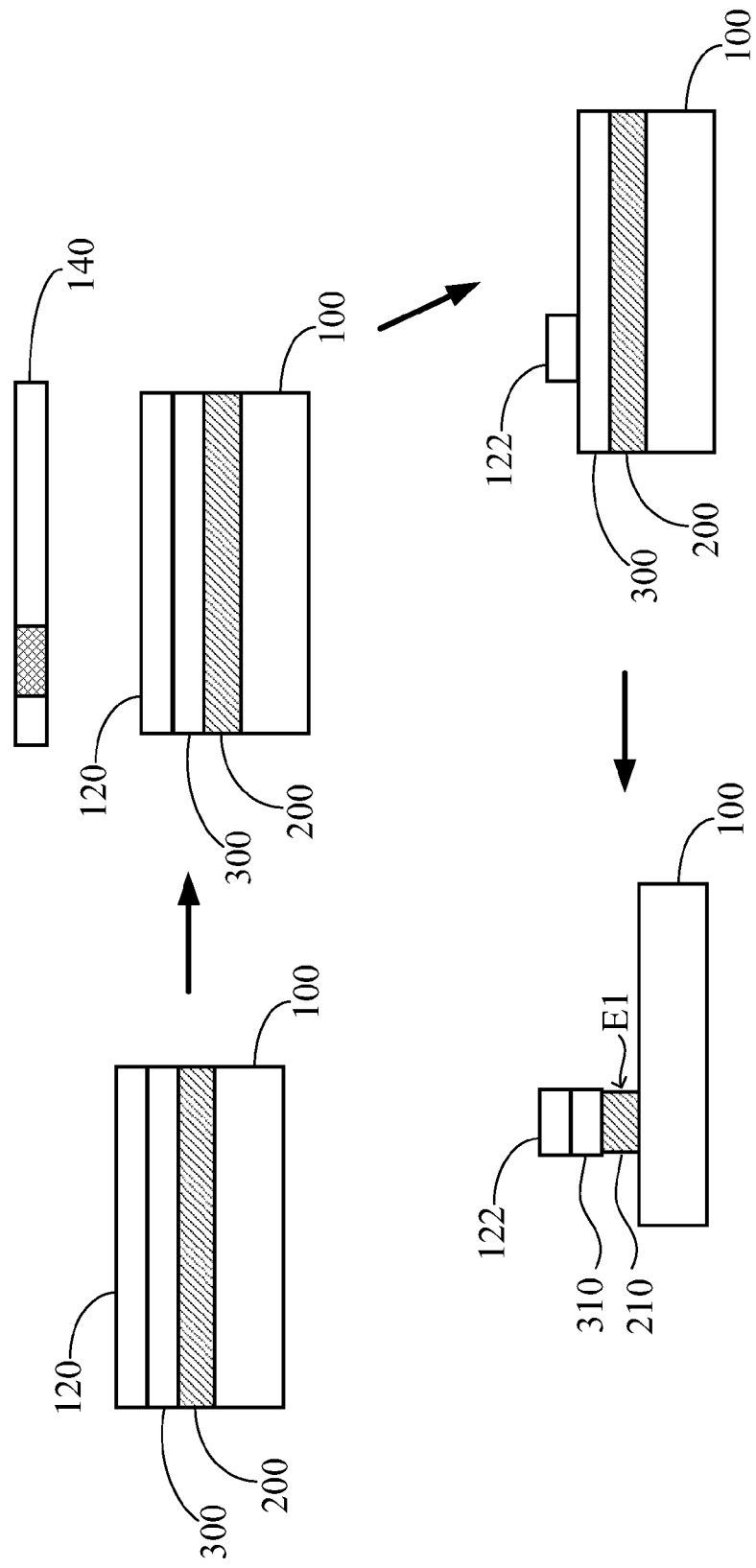
FIG. 6 is a schematic drawing illustrating the processes of FIG. 5.

The step S20 of using the first photomask to pattern will be explained in detail below. Referring to FIG. 5 and FIG. 6, FIG. 5 is a flow chart illustrating the steps of using the first photomask to pattern; FIG. 6 is a schematic drawing illustrating the processes of FIG. 5. The step of using the first photomask to pattern begins with step S21.

At step S21, a photoresist layer 120 is formed on the protective layer 300, and then step S22 is carried out. At step S22, the photoresist layer 120 is exposed via the first photomask 140, and then step S23 is carried out. At step S23, the exposed photoresist layer 122 is developed for forming a patterned photoresist layer 122, and then step S24 is carried out. At step S24, parts of the protective layer 300 and the first metal layer 200 which are not covered by the patterned photoresist layer 122 are sequentially etched, and then step S25 is carried out. At step S25, the patterned photoresist layer 122 is removed, as shown in FIG. 4 finally.

Figure 7:
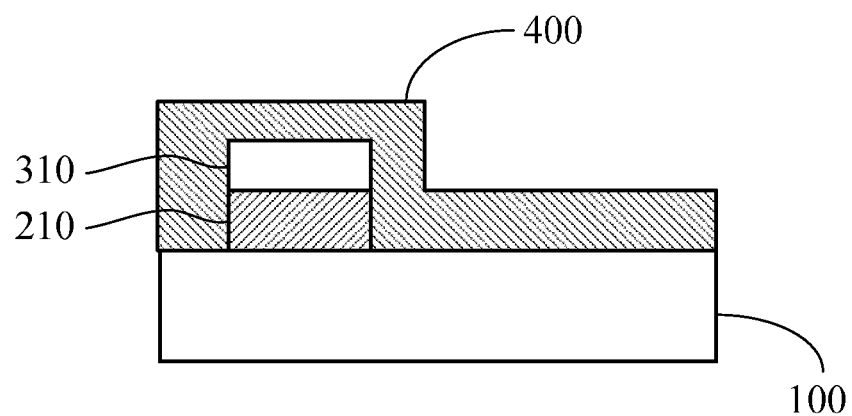
FIG. 7 is a schematic drawing illustrating the step S30.

Referring to FIG. 7 and FIG. 2, FIG. 7 is a schematic drawing illustrating the step S30. At step S30, a second metal layer 400 is formed on the substrate 100 and the patterned protective layer 310, and then the step S40 is carried out. Similarly, the second metal layer 400 can be formed by using the physical vapor deposition or the chemical vapor deposition.

Figure 8:
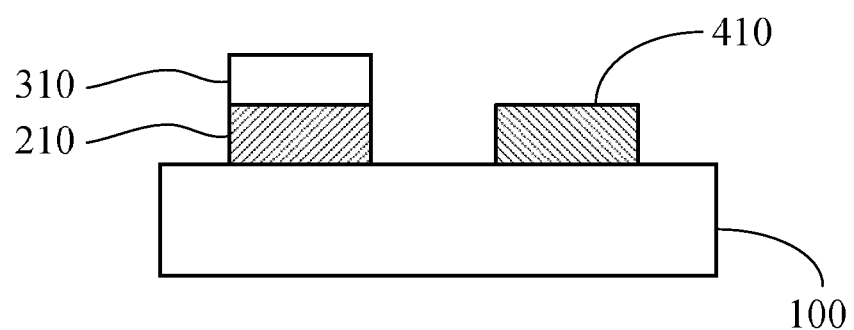
FIG. 8 is a schematic drawing illustrating the step S40.

Referring to FIG. 8 and FIG. 2, FIG. 8 is a schematic drawing illustrating the step S40. At step S40, the second metal layer 400 is patterned by using a second photomask (referring to FIG. 10), so as to form a second metal line 410, which is adjacent to the first metal line 210, and then step S50 is carried out.

Figure 9:
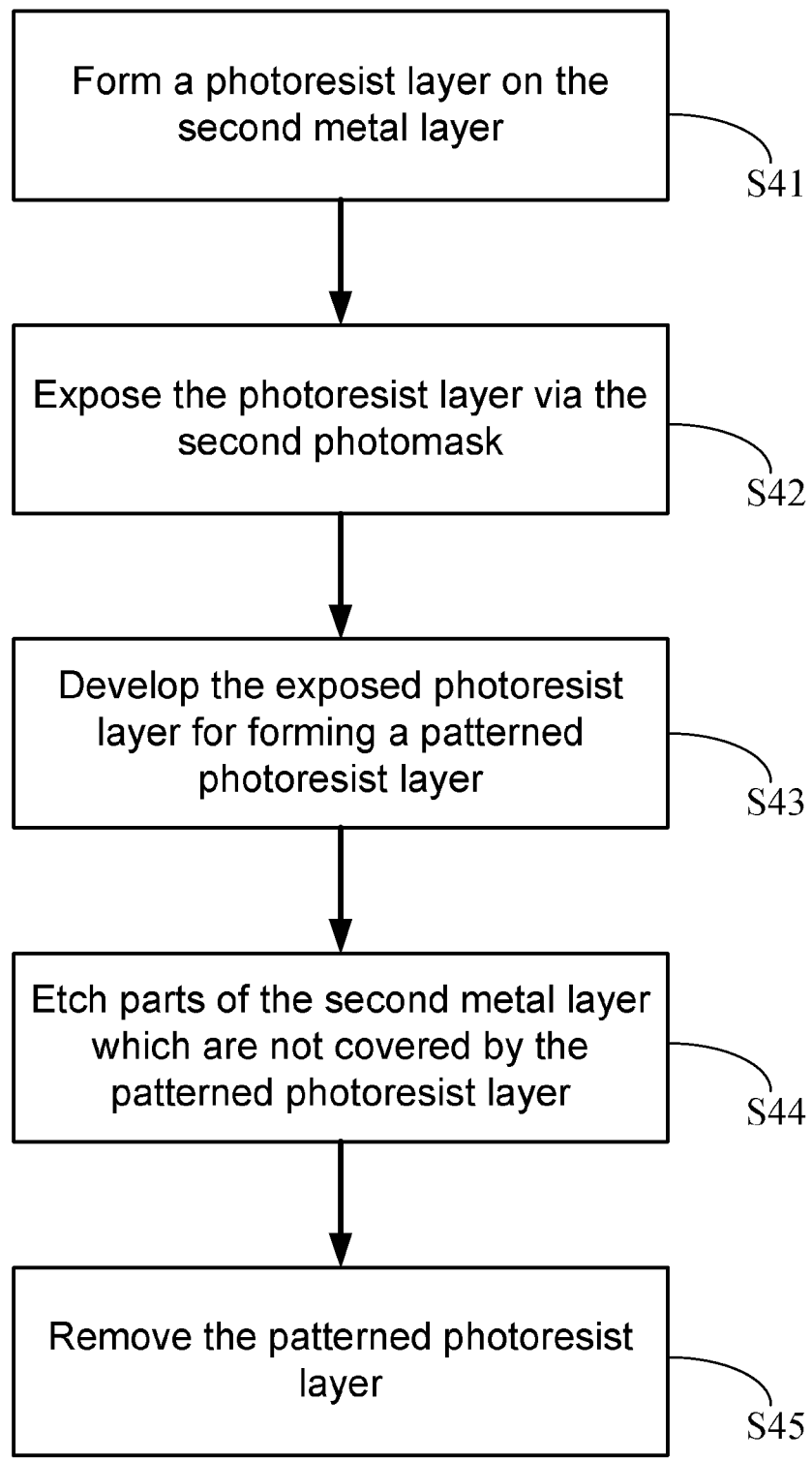
FIG. 9 is a flow chart illustrating the steps of using the second photomask to pattern.
Figure 10:
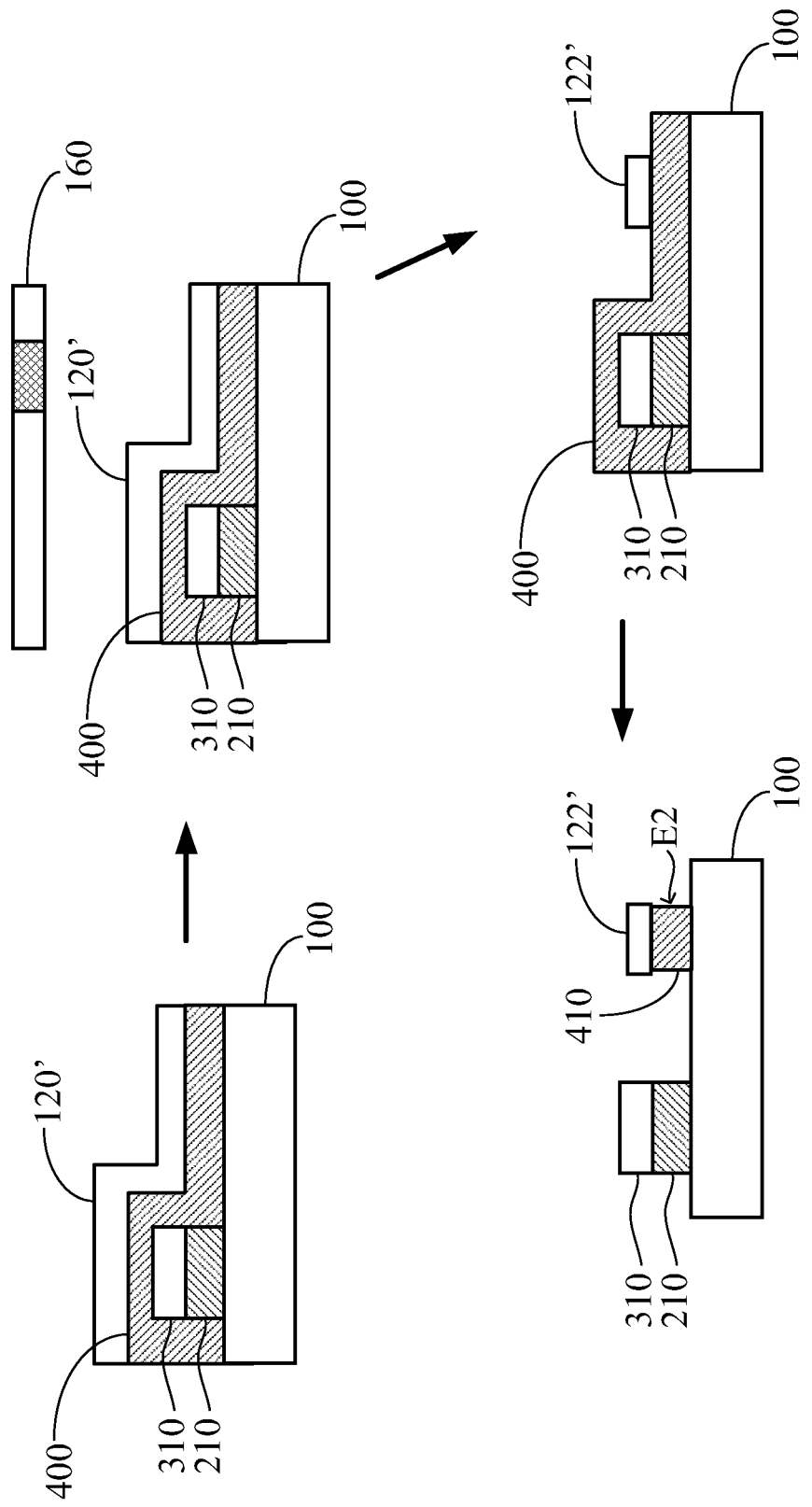
FIG. 10 is a schematic drawing illustrating the processes of FIG. 9.

The step S40 of using the second photomask to pattern will be explained in detail below. Referring to FIG. 9 and FIG. 10, FIG. 9 is a flow chart illustrating the steps of using the second photomask to pattern; FIG. 10 is a schematic drawing illustrating the processes of FIG. 9. The step of using the second photomask to pattern begins with step S41.

At step S41, a photoresist layer 120' is formed on the second metal layer 400, and then step S42 is carried out. At step S42, the photoresist layer 120' is exposed via the second photomask 160, and then step S43 is carried out. At step S43, the exposed photoresist layer 120' is developed for forming a patterned photoresist layer 122', and then step S44 is carried out. At step S44, parts of the second metal layer 400 which are not covered by the patterned photoresist layer 122' are etched, and then step S45 is carried out. At step S45, the patterned photoresist layer 122' is removed, finally as shown in FIG. 8.

Figure 11:
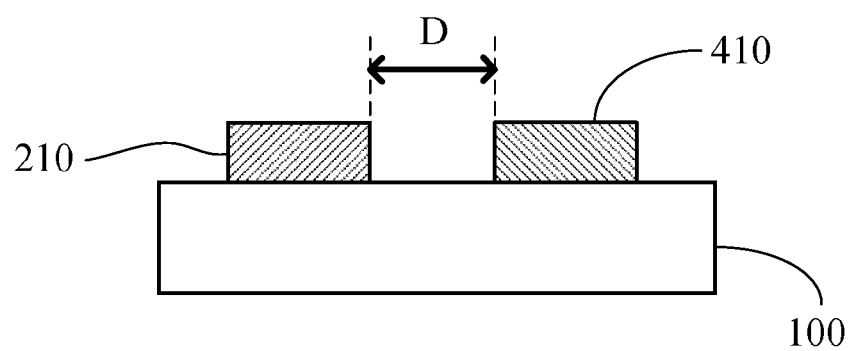
FIG. 11 is a schematic drawing illustrating the step S50.

Referring to FIG. 11 and FIG. 2, FIG. 11 is a schematic drawing illustrating the step S50. At step S50, the patterned protective layer 310 on the first metal line 210 is removed, and then the fabrication of the wires with the narrow spacing is completed. It is worth mentioning that the first metal line 210 and the second metal line 410 are not simultaneously formed on the same layer by one photomask process. Thus, the first metal line 210 and the second metal line 410 has a distance D therebetween, and the distance D may be less than a minimal line spacing that can be reached in the patterning step, that is, the minimal line spacing that can be reached in said exposure machine. Preferably, the distance D is less than 1.5 micrometers.

It should be noted that the first metal layer 200 and the second metal layer 400 are made of an identical metal material. Therefore, there is a first side-etched removal E1 when etching the first metal layer 200 in the step S24; there is a second side-etched removal E2 when etching the first metal layer 400 in the step S44. Furthermore, the first side etched removal E1 is identical to the second side-etched removal E2. It can be seen from the foregoing that the first metal line 210 and the second metal line 410 have the same line widths; therefore, they have the same resistances, and the drawback of the striped defect is solved.

However, in other embodiments, the first metal layer 200 and the second metal layer 400 are made of a similar metal material. More specifically, the first metal layer 200 and the second metal layer 400 have similar sheet resistances thereof. In addition, there is a first side-etched removal E1 when etching the first metal layer 200 in the step S24; there is a second side-etched removal E2 when etching the first metal layer 400 in the step S44. Furthermore, the first side etched removal E1 is similar to the second side-etched removal E2. It can be seen from the foregoing that the first metal line 210 and the second metal line 410 have similar line widths. Thus, the more similar line widths can be formed on the same layer, thereby overcoming the drawback of the striped defect in the prior art.

In summary, the present invention employs the two photomask processes to form the first metal line 210 and the second metal line 410 on the same layer, thereby overcoming the limitation of the line spacing of the exposure machine to achieve the demand of the narrow bezel. Moreover, because the first metal line 210 and the second metal line 410 are formed on the same layer, the drawback of the broken line in the conventional dual trace is overcome. For the same reason, because the first metal line 210 and the second metal line 410 are formed on the same layer, the manufacture processes are easily controlled to reach the same line widths, so as to solve the striped defect stemming from the different line widths in the prior.

While the preferred embodiments of the present invention have been illustrated and described in detail, various modifications and alterations can be made by persons skilled in this art. The embodiment of the present invention is therefore described in an illustrative but not restrictive sense.

What is claimed is:

1. A method for forming wires with a narrow spacing, the method comprising steps of:
    sequentially forming a first metal layer and a protective layer on a substrate;
    using a first photomask to pattern the first metal layer and the protective layer, to form a first metal line and a patterned protective layer thereon;
    forming a second metal layer on the substrate and the patterned protective layer;
    using a second photomask to pattern the second metal layer, so as to form a second metal line adjacent to the first metal line; and
    removing the patterned protective layer on the first metal line;
    wherein the first metal line and the second metal line are formed to have a spacing between the first metal line and the second metal line, and the spacing is less than a minimal line spacing that can be reached in the patterning step, and wherein the spacing is less than 1.5 micrometers.

2. The method of claim 1, wherein the step of using the first photomask to pattern further comprises steps of:
    forming a photoresist layer on the protective layer;
    exposing the photoresist layer via the first photomask;
    developing the exposed photoresist layer for forming a patterned photoresist layer;
    sequentially etching parts of the protective layer and the first metal layer which are not covered by the patterned photoresist layer; and
    removing the patterned photoresist layer.

3. The method of claim 2, wherein the step of using the second photomask to pattern further comprises steps of:
    forming a photoresist layer on the second metal layer;
    exposing the photoresist layer via the second photomask;
    developing the exposed photoresist layer for forming a patterned photoresist layer;
    etching parts of the second metal layer which are not covered by the patterned photoresist layer; and
    removing the patterned photoresist layer.

4. The method of claim 3, wherein the first metal layer has a first side-etched removal when etching the first metal layer;
    the second metal layer has a second side-etched removal when etching the second metal layer; and
    the first side etched removal is identical to the second side-etched removal.

5. The method of claim 3, wherein the first metal layer has a first side-etched removal when etching the first metal layer;
    the second metal layer has a second side-etched removal when etching the second metal layer; and
    the first side etched removal is similar to the second side-etched removal.

6. The method of claim 1, wherein the first metal layer and the second metal layer are made of an identical metal material.

7. The method of claim 6, wherein the first metal layer and the second metal layer have similar sheet resistances thereof.

8. The method of claim 1, wherein the first metal layer and the second metal layer are made of a similar metal material.

9. A method for forming wires with a narrow spacing, the method comprising steps of:
    sequentially forming a first metal layer and a protective layer on a substrate;
    using a first photomask to pattern the first metal layer and the protective layer, to form a first metal line and a patterned protective layer thereon;
    forming a second metal layer on the substrate and the patterned protective layer;
    using a second photomask to pattern the second metal layer, so as to form a second metal line adjacent to the first metal line; and
    removing the patterned protective layer on the first metal line
    wherein the first metal layer and the second metal layer are made of an identical metal material.

10. The method of claim 9, wherein the first metal line and the second metal line are formed to have a spacing between the first metal line and the second metal line, and the spacing is less than a minimal line spacing that can be reached in the patterning step, and wherein the spacing is less than 1.5 micrometers.

11. The method of claim 9, wherein the first metal layer and the second metal layer have similar sheet resistances thereof.

12. A method for forming wires with a narrow spacing, the method comprising steps of:
    sequentially forming a first metal layer and a protective layer on a substrate;
    using a first photomask to pattern the first metal layer and the protective layer, to form a first metal line and a patterned protective layer thereon;
    forming a second metal layer on the substrate and the patterned protective layer;
    using a second photomask to pattern the second metal layer, so as to form a second metal line adjacent to the first metal line; and
    removing the patterned protective layer on the first metal line
    wherein the first metal layer and the second metal layer are made of a similar metal material.

13. The method of claim 12, wherein the first metal line and the second metal line are formed to have a spacing between the first metal line and the second metal line, and the spacing is less than a minimal line spacing that can be reached in the patterning step, and wherein the spacing is less than 1.5 micrometers.

* * * * *